United States Patent

Yokota

[11] Patent Number: 5,386,797
[45] Date of Patent: Feb. 7, 1995

[54] SINGLE CRYSTAL OF COMPOUND, LASER ROD, LASER OSCILLATOR, SCINTILLATOR, CT SCANNER, COLOR DISPLAY AND PROCESS FOR PREPARING THE SAME

[75] Inventor: Kazuto Yokota, Yokohama, Japan

[73] Assignee: Kabushiki Kaisha Toshiba, Kanagawa, Japan

[21] Appl. No.: 37,109

[22] Filed: Mar. 26, 1993

[30] Foreign Application Priority Data

Mar. 27, 1992 [JP] Japan .................... 4-068895

[51] Int. Cl.6 ............................ C30B 13/16
[52] U.S. Cl. ........................ 117/41; 117/49; 117/50; 117/944
[58] Field of Search .......... 136/616.1, DIG. 63, 136/72, 621, 624; 117/944, 41, 49, 50

[56] References Cited

U.S. PATENT DOCUMENTS

| | | | |
|---|---|---|---|
| 3,833,862 | 9/1974 | Wickersheim et al. | 156/616.1 |
| 4,752,424 | 6/1988 | Matsuda et al. | 501/126 |
| 4,863,882 | 9/1989 | Matsuda et al. | 501/94 |
| 5,166,948 | 11/1992 | Gavrilovic et al. | 372/70 |

OTHER PUBLICATIONS

L. E. Sobon et al., "Growth and Properties of Lanthanum Oxysulfide Crystals," Journal of Applied Physics, vol. 42, No. 8 (Jul. 1971), pp. 3049-3053.

Primary Examiner—Robert Kunemund
Attorney, Agent, or Firm—Finnegan, Henderson, Farabow, Garrett & Dunner

[57] ABSTRACT

A single crystal of a compound comprises which easily decomposes at a temperature around the melting point and evaporates at least a part of the compound having a volume of 5 cc or more and a composition deviation of respective elements from the stoichiometric composition of the compound being within the range of ±5% in terms of weight ratio. Also, a process for preparing a single crystal of a compound comprises the steps of deaerating and sealing powder of a starting material for the single crystal in a sealable capsule, sintering the powder by subjecting to heat treatment (HIP treatment) at a temperature ½ or higher of the melting point in terms of the absolute temperature while applying high pressure to a sealed material of the powder, deaerating and sealing the sintered body in a sealable capsule made of a similar high melting point substance and having an inner shape corresponding to the shape of the sintered body, and preparing a single crystal by subjecting a sealed material of the sintered body to heat treatment at a temperature of the melting point of the starting material of the single crystal under pressure. As the single crystal of a compound, high quality single crystals with a large size such as $RE_2O_2S$ or $REVO_4$ (RE is a rare earth element) can be obtained.

12 Claims, 4 Drawing Sheets

BOLD SHOWS FLOW OF SCANNING DATA AND IMAGE DATA

FIG. 4

SINGLE CRYSTAL OF COMPOUND, LASER ROD, LASER OSCILLATOR, SCINTILLATOR, CT SCANNER, COLOR DISPLAY AND PROCESS FOR PREPARING THE SAME

BACKGROUND OF THE INVENTION

This invention relates to a high quality single crystal of a compound which is likely decomposed at a neighbor of the melting point, and a process for preparing the same.

Oxysulfides of rare earth elements represented by the formula: $RE_2O_2S$ where RE represents at least one element selected from rare earth elements including Y have recently been attracted to attention as constitutional materials for scintillators or a laser rod. For example, single crystals such as $Gd_2O_2S$ to which Nd is doped, $La_2O_2S$ to which Nd is doped, etc. can effect luminescence with high efficiency as compared to the conventional YAG laser, etc. so that researches have now been made to use these crystals as a material for a laser rod. Also, single crystals such as $Gd_2O_2S$ to which Pr is doped, etc. are expected to be used as a scintillator material of a CT scanner or a display for a color cathode-ray tube. Further, single crystals such as $Gd_2O_2S$ to which Eu or Tb is doped, etc. are expected to be used as a scintillator material of a display for a color cathode-ray tube.

As methods for preparing the single crystals of oxysulfide as mentioned above, there have been investigated the methods such as a usual melt drawing method (e.g. Czochralski method), a zone melting method, a flux method, a vertical Bridgeman method (e.g. Bridgeman-Stockberger method) and others, and some of them has been tried. However, $RE_2O_2S$ has difficulty because it is decomposed at a temperature around the melting point and sulfur component is likely evaporated so that the above conventional single crystal growing method involved some problems. For example, if the usual melt drawing method is applied, sulfur component is evaporated when melting or drawing so that the atomic ratio of sulfur of the resulting single crystal composition is likely smaller than the stoichiometric composition whereby it is difficult to obtain a high quality single crystal. There have been attempted to effect the melt drawing under pressurized atmosphere or apply to a melting solution capsule method, but sufficient effects have not yet been obtained.

Also, there has been considered to carry out zone melting by using a compact powder material obtained by placing $RE_2O_2S$ powder in an airtight container and subjecting to heat treatment under inert atmosphere. However, in the case of powder, even when it is filled in a container closed-pack, its occupied volume ratio is at most 60% or so whereby sulfur component is evaporated to a space formed during partial melting of the powder. Thus, similarly in the above melt drawing method, quality of a single crystal is lowered.

Contrary to the above methods, in the flux method, if a suitable flux can be found depending on the objective composition, growth of a single crystal can be carried out at a temperature 50 to 60% of the melting point in terms of the absolute temperature whereby evaporation of sulfur component can be prevented and high quality single crystal can be obtained. In fact, there has been reported that high quality single crystal of $La_2O_2S$ could be obtained by using $K_2S$ as a flux (see Proceedings of 12th Rare Earth Research Conf (1976)). However, the size of the single crystal obtained by the flux method is at most several mm or so in diameter. Even when a material having the size exceeding the above can be obtained, the obtained material is an agglomerate of these fine single crystals so that it cannot be practically used for industrial purpose.

On the other hand, there has been reported that relatively high quality single crystal of $RE_2O_2S$ with a larger size than that of the flux method can be obtained by the vertical bridgeman method (see JOURNAL OF APPLIED PHYSICS, Vol. 42, Number 8, July (1971)). In the vertical bridgeman method, when crystal is grown in, for example, an Ar atmosphere at 10 $kgf/cm^2$, a composition at a melted portion will change with a lapse of time and thus, even if a good single crystal with a stoichiometric composition can be obtained at an initial stage, sulfur component gradually lacks in the composition. Accordingly, a volume of the single crystal with high quality is a little and a single crystal having a practically usable size cannot yet be obtained.

As described above, whereas an oxysulfide of a rare earth element represented by the formula $RE_2O_2S$ has been attracted to attention as a constitutional material for a laser rod or a scintillator with high efficiency, it has a problem that $RE_2O_2S$ itself is likely decomposed at a temperature around the melting point and sulfur component is likely evaporated. Thus, it has a problem that high quality single crystal having a sufficient volume which can be applied to an industrial use and has a composition substantially the same with a stoichiometric one cannot be obtained only by applying the conventional single crystal growing methods.

Also, the problem of preparing single crystal caused by evaporation of a component at a temperature around the melting point occurs not only in $RE_2O_2S$ but also, for example, in preparation of $REVO_4$ singly crystal which is expected to be applied to a laser rod.

Thus, for preparing a singly crystal of a compound in which at least part thereof is likely evaporated at a temperature around the melting point, it has been strongly demanded to maintain quality of the single crystal by depressing evaporation of a component and to enable preparation of a single crystal having a practical size used for an industrial use.

SUMMARY OF THE INVENTION

An object of the present invention is to provide a high quality single crystal of a compound with less stoichiometrical deviation in composition of respective element constituting the compound and also having a large size of a crystal.

Another object of the present invention is to provide a process for preparing single crystal of a compound at least part of which is decomposed at a temperature around the melting point wherein single crystal of the compound can be relatively easily obtained with good reproducibility.

The single crystal of a compound according to the present invention is a single crystal of a compound in which at least part of the compound is decomposed at a temperature around the melting point, comprising a volume of 5 cc or more and composition deviation of respective elements from a stoichiometric composition of the above compound being within the range of ±5% in terms of weight ratio.

A process for preparing the single crystal of a compound according to the present invention comprises, for preparing a single crystal of a compound in which at least part of the compound is decomposed at a temperature around the melting point, the steps of: deaerating and sealing powder of a starting material of the above single crystal in a first sealable vessel made of a high melting point substance having low reactivity with the starting material of the single crystal at a temperature region around a treatment temperature; sintering the powder by subjecting to heat treatment at a temperature ½ or higher of the melting point of the starting material of the single crystal in terms of the absolute temperature while applying high pressure to a sealed material of the above powder; deaerating and sealing the resulting sintered body in a second sealable vessel made of a high melting point substance having low reactivity with the sintered body at a temperature during a process for single crystallization and having an inner shape corresponding to the shape of the sintered body; and preparing single crystal by subjecting a sealed material of the sintered body to heat treatment at a temperature higher than the melting point of the above starting material of the single crystal under pressure.

As the compounds related to the present invention, there may be mentioned, for example, oxysulfide of a rare earth element represented by the formula:

$$RE_2O_2S \quad (1)$$

wherein RE represents at least one element selected from a rare earth element including Y, such as Y, La, Ce, Pr, Nd, Sm, Eu, Gd, Tb, Dy, Ho, Er, Tm, Yb, Lu, etc., hereinafter the same, or vanadium oxide containing a rare earth element represented by the formula:

$$REVO_4 \quad (2)$$

and the like. The oxysulfide of a rare earth element represented by the formula (1) has a property that the compound decomposes at a temperature around the melting point and likely evaporates sulfur components, and the vanadium oxide containing a rare earth element represented by the formula (2) has a property that the compound decomposes at a temperature around the melting point and likely evaporates vanadium component. Thus, these compounds are suitable material for the present invention.

However, the present invention is not limited by these compounds and can be applied to various kinds of compounds in which at least part of the compound is capable of decomposing at a melting point.

The "compound at least part of which is likely decomposed at a temperature around the melting point" herein mentioned in the present invention means a compound in which a composition ratio of the constitutional elements changes from an initial stoichiometric composition ratio when the compound is heated to room temperature or more under the conditions such as in atmosphere, in vacuum or in sufficiently low pressure inert gas atmosphere.

In the process for preparing a single crystal of a compound according to the present invention, a starting material for a single crystal having decomposability is subjected to a hot isostatic press (hereinafter abbreviated to as "HIP") treatment under high temperature and high pressure in a capsule. When such a treatment is carried out, even when decrease in a volume accompanied by sintering of a powder material occurred, treatment can be carried out at a state substantially no void.

Thus, even when a substance which decomposes in usual sintering procedure is used, it can be sintered without causing any decomposition, i.e. without changing the composition to give a polycrystalline sintered body having a density of 90% or more based on the theoretical density. The polycrystalline sintered body which is once prepared by not varying the composition with high density, used as a starting material for a single crystal, is subjected to heat treatment for preparing a single crystal by sealing in a vessel having substantially no void from an initial stage. Thus, even when it is melted, a void accompanying with the melting scarcely occurred. Thus, no decomposition of components occurs so that high quality single crystal of a compound can be obtained. Also, the size thereof is limited only by the preparation conditions of a HIP product so that a single crystal of a compound with an optional size, in other words, a large size, can be obtained. As mentioned above, the single crystal of a compound obtained by the present invention has high quality which means substantially the same composition as that of stoichiometric one, and has a large size so that it has practical availability in an industrial sense as a laser rod, scintillator, laser oscillator, CT scanner, color display, etc.

DESCRIPTION OF THE PREFERRED EMBODIMENTS

In the following, Examples of the present invention will be explained.

FIG. 1 is a schematic view showing the preparation process of a single crystal of a compound according to one Example of the present invention. First, as shown in FIG. 1(a), powder of the compound represented by the formulae (1) or (2) as mentioned above is placed under pressure in a sealable vessel (capsule) 2 as a starting material 1 for a single crystal. The starting material for a single crystal is not limited only to a compound powder but a mixture of precursors which is capable of forming a desired compound by a reaction may be also used. For example, so long as a compound represented by the formula (1), a mixed powder of $RE_2O_3$ powder and S powder may be used as the starting material 1 for a single crystal.

Figure 1A:
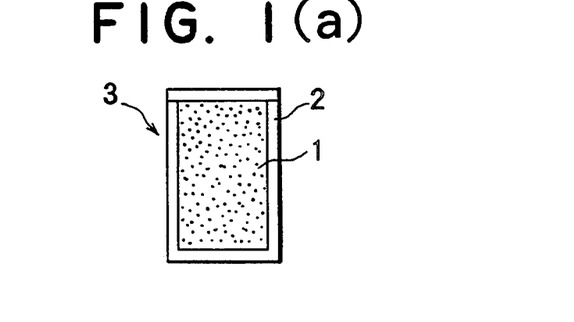
FIG. 1(a), FIG. 1(b), FIG. 1(c) and FIG. 1(d) are schematic views showing the preparation process of a single crystal of a compound according to one Example of the present invention.

Also, as the above capsule 2, it is preferably used one made of a metal having a high melting point such as Ta, Mo, W, Pt, Nb, etc., which have less reactivity with the starting material 1 for a single crystal at a temperature region around the treatment temperature as described hereinbelow. In such a plastic deformable capsule 2, the above starting material 1 for a single crystal is filled under pressure, and after deaerating, the capsule is sealed.

Figure 1B:
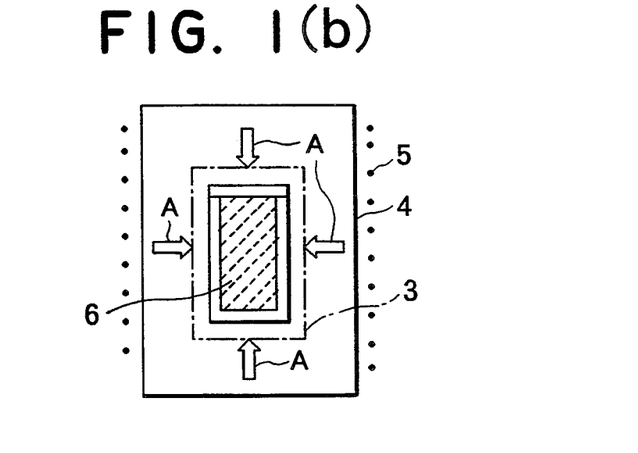

Next, the sealed material 3 of the above powder is subjected to heat treatment at a temperature $\frac{1}{2}$ or more of the melting point of the starting material 1 for a single crystal in terms of the absolute temperature while applying a high pressure from outside of the sealed capsule 2, for example, with a pressure of 300 kgf/cm$^2$ or higher, i.e. the so-called HIP treatment. More specifically, as shown in FIG. 1(b), the above sealed material 3 is placed in an HIP apparatus 4, and applying an isotropic pressure (shown as an arrow A in the figure) to the sealed material 3 using an inert gas such as an Ar gas, etc. as a pressure medium, and raising the temperature to the sinterable temperature or more and maintaining the temperature for a predetermined time using a graphite heater 5, etc. to prepare an HIP sintered body 6.

When the HIP treatment is thus applied to the starting material 1 for a single crystal, whereas volume decrease occurs in accordance with sintering, the capsule 2 itself shrinks with decrease of the volume so that the starting material can be treated under the condition which causes substantially no void. That is, when a decomposable substance is treated in a capsule under high temperature and high pressure, it can be treated without substantially causing void even when volume decrease accompanied by sintering of powder occurs. Thus, even when a substance which decomposes under the usual sintering conditions is used, it can be sintered to obtain a polycrystalline sintered body without causing any decomposition, i.e. without the deviation of the composition. For example, in the compound represented by the formula (1), evaporation of S can be prevented and in the compound of the formula (2), that of V can be prevented. Thus, by applying the HIP treatment to the starting material 1 for a single crystal having decomposable property, a polycrystalline sintered body 6 having substantially no deviation in the composition due to decomposition.

If the temperature for the above HIP treatment is a temperature less than $\frac{1}{2}$ of the melting point of the starting material for a single crystal in terms of the absolute temperature, or the applied pressure is less than 300 kgf/cm$^2$, decomposition of components cannot sufficiently be prevented and the resulting polycrystalline sintered body cannot be made sufficiently high density whereby there occurs a possibility of causing decomposition at the later stage of making a single crystal. Accordingly, it is preferred to set the pressure at the HIP treatment to 300 kgf/cm$^2$ or higher. If it is 500 kgf/cm$^2$ or higher, there is no fear of causing decomposition. More preferred pressure is 1000 kgf/cm$^2$ or higher. The temperature at the HIP treatment may be a temperature $\frac{1}{2}$ or more of the melting point in terms of the absolute temperature. If it is too low, sintering is insufficient, while it is too high, decomposition may occur even under high pressure so that it is preferred to set the temperature 60 to 90% of the melting point in terms of the absolute temperature. The HIP treatment may be effective even when it is a short time, but for obtaining a high density sintered body, one hour or more is preferred.

Figure 1C:
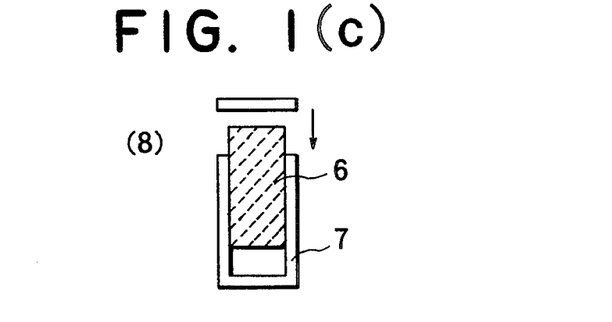

Thereafter, the above polycrystalline sintered body 6 is once taken out from the capsule 2, and if necessary, after molding the sintered body to a desired size, as shown in FIG. 1(c), the above polycrystalline sintered body 6 is placed in a sealable capsule 7 having an inner shape corresponding to the shape of the above sintered body 6 and made of a similar material as that of the above capsule and deaerated and sealed so as to make void as little as possible.

Figure 1D:
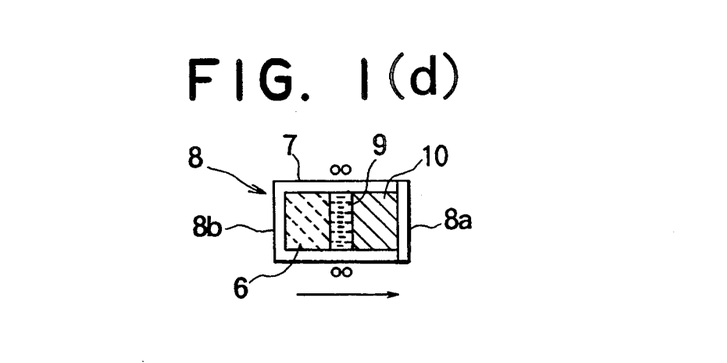

Then, under the condition that the sintered body is sealed in the capsule 7, the polycrystallized starting material 6 for a single crystal is subjected to heat treatment under the pressure of 5 kgf/cm$^2$ or higher and at a temperature higher than the melting point to prepare a desired single crystal. As the heat treatment during the preparation step of the single crystal, the so-called zone melting, etc. can be applied to. This is a method that, as shown in FIG. 1(d), by making a melted band portion 9 in a sealed material 8 obtained by sealing the polycrystalline sintered body 6 in the capsule 7 so as to make void as little as possible, and the melted band 9 is gradually moved from one end 8a of the sealed material 8 to the other end 8b to prepare a single crystal 10. The above zone melting may be carried out repeatedly with a plural times. The temperature of the above step for making a single crystal is preferably within the range of the melting point (MP) of the compound or more to 1.05 MP or less.

Thus, a high quality single crystal 10 of a compound can be obtained stably without causing any decomposition by applying a heat treatment for preparing a single crystal to a starting material 6, having a polycrystalline structure prepared without the deviation of the composition, in a capsule 7 in which no void is substantially generated from an initial stage, since, even when, for example, partial melting state in the zone melting is caused, generation of voids accompanied by melting of the starting material does not occur.

The single crystal 10 of a compound obtained by the above preparation steps has a volume of 5 cc or more, and deviation in composition of the respective elements of the desired compound based on the stoichiometric composition is within the range of ±5% in terms of a weight ratio. In other words, it is realized that a single crystal of a compound having a high industrial value, a high quality with less deviation from the stoichiometric composition and a large size can be obtained stably. It is also possible to prepare a single crystal of a compound having a volume less than 5 cc, but practicability as a laser rod or a scintillator is lowered so that the volume of the single crystal of a compound is preferably 5 cc or more. However, the size of a single crystal according to the present invention is limited only by preparation conditions of an HIP product. Therefore, an optional size of a single crystal can be obtained and, for example, it is also possible to obtain a large sized single crystal exceeding 100 cc.

When deviation in a composition of the respective elements from the stoichiometric composition of the above single crystal exceeds ±5%, characteristics as a laser rod or a scintillator is lowered and sufficient effects cannot be obtained. Accordingly, the range of deviation in a composition of the respective element is more preferably ±2%. When the above is adapted to the above formulae (1) and (2), the single crystal of a compound according to the present invention can be shown, for example, formula: RE$_2$O$_2$S$_{1-x}$            (3)

formula: REV$_{1-x}$O$_4$            (4)

wherein x represents a number satisfying $0<x$.

In the above formulae (3) and (4), a deviation from the stoichiometric composition comes from deficiency of S in the case of formula (3) and of V in the case of formula (4), deviation in a composition of the other elements than the above can be accepted so long as above mentioned deficiency related elements are within the range of ±5%.

As the single crystal of a compound, $Gd_2O_2S$ to which Nd is doped, $La_2O_2S$ to which Nd is doped, etc. are available for a laser rod, and $Gd_2O_2S$, $La_2O_2S$ and $Y_2O_2S$ to which Pr is each doped, etc. are available as a scintillator. Also, $REV_{1-x}O_4$ has availability for a laser rod, etc.

Next, specific examples applied to the preparation process of a single crystal of a compound as mentioned above is described.

EXAMPLE 1

Powder of gadolinium oxysulfide ($Gd_2O_2S$: melting point 2100° C.) was placed in a capsule made of tantalum having an inner volume of 500 cc, and after deaerating, it was sealed. Then, the sealed capsule was placed in an HIP apparatus, and treated by using an Ar gas as a pressure medium under 1000 kgf/cm$^2$ at 1500° C. for one hour. The bulk density of the resulting treated compact was 99% based on the true value.

Subsequently, the capsule made of tantalum was removed from the above treated compact to take out a polycrystalline sintered body of $Gd_2O_2S$ and cut to a suitable shape. The above cut product was placed in a capsule made of tantalum and having substantially the same inner shape as that of the cut product, and after deaerating, the capsule was sealed.

Thereafter, to the sealed capsule was applied zone melting under a pressure of 10 kgf/cm$^2$ at 2100° C. to prepare a $Gd_2O_2S$ single crystal.

The thus prepared $Gd_2O_2S$ single crystal had a size of about 400 cc. Also, when the composition of the $Gd_2O_2S$ single crystal was analyzed, the results obtained were Gd=83.08%, O=8.46% and S=8.46% whereas the stoichiometric composition was Gd=83.08%, O=8.45% and S=8.47% in terms of weight ratio. Thus, deviation of respective elements from the stoichiometric composition was within the range of ±5% in terms of weight ratio and it could be confirmed that the single crystal had high quality. The above analysis of the composition was carried out at the positions in the center part of single crystal and 1 cm from the both ends, and each showed substantially the same composition.

The above analyses were carried out as follows. With regard to the main components of La, Y, Gd, etc., they were dissolved with aqua regia under heating and determined by the EDTA titration method; and with regard to S, it was decomposed by an HBr—HNO$_3$—HCl solution under heating, separated by a cation exchange resin and determined by separating from a filtrate as BaSO$_4$. With regard to minute components of Pr, Tb, Eu and Nd, they were dissolved with aqua regia under heating and analyzed by the ICP emission spectroscopic analysis.

Comparative Example 1

In the same manner as in Example 1, a zone melting was carried out by using a material in which gadolinium oxysulfide ($Gd_2O_2S$) powder was filled in a capsule made of tantalum under pressure and sealed after deaerating. The size of the resulting $Gd_2O_2S$ single crystal was about 400 cc, but the composition thereof was Gd=85.05%, O=8.65% and S=6.30% whereby deviation of S component from the stoichiometric composition was remarkable.

Comparative Example 2

In a crucible made of tantalum was placed gadolinium oxysulfide ($Gd_2O_2S$) powder and after melting in an atmosphere under pressure, drawing of a crystal was carried out by using a seed crystal. The size of the resulting $Gd_2O_2S$ single crystal was 3 cc, and the composition thereof was Gd=85.15%, O=8.75% and S=6.10% whereby deviation of S component from the stoichiometric composition was remarkable.

Comparative Example 3

Powder of gadolinium oxysulfide ($Gd_2O_2S$) was placed and sealed in a capsule made of tantalum, and after melting in an atmosphere under pressure, it was gradually cooled by applying a vertical Bridgeman method to effect growth of a single crystal. The size of the resulting $Gd_2O_2S$ single crystal was 15 cc, and the composition thereof was Gd=83.07%, O=8.44% and S=8.49% at the growth initiation side but those at the growth termination side were Gd=85.45%, O=8.85% and S=5.70% whereby deviation of S component from the stoichiometric composition was remarkable. Also, the size of a single crystal wherein deviation of the composition from the stoichiometric composition is substantially within ±5% in terms of weight ratio was 3 cc.

EXAMPLES 2 to 4

In the same manner as in Example 1, single crystals of yttrium oxysulfide ($Y_2O_2S$) (Example 2), lanthanum oxysulfide ($La_2O_2S$) (Example 3) and lutetium oxysulfide ($Lu_2O_2S$) (Example 4) were prepared, respectively. The melting points of these single crystals were each in the range of 2100 to 2200° C. Also, the sizes of the respective single crystals were each about 400 cc. The compositions of these single crystals were analyzed in the same manner as in Example 1. The results are summarized in Table 1.

TABLE 1

| Example No. | | Composition ratio (weight %) | | |
|---|---|---|---|---|
| | | | S | O |
| | | Y | | |
| 2 | Stoichiometric ratio | 73.52 | 13.25 | 13.23 |
| | Found value | 73.54 | 13.24 | 13.22 |
| | | La | | |
| 3 | Stoichiometric ratio | 81.26 | 9.38 | 9.36 |
| | Found value | 81.28 | 9.36 | 9.38 |
| | | Lu | | |
| 4 | Stoichiometric ratio | 84.52 | 7.75 | 7.73 |
| | Found value | 84.56 | 7.73 | 7.71 |

As can be seen from Table 1, the single crystals of respective Examples had deviation of respective elements from the stoichiometric composition of each within the range of ±5% whereby it could be confirmed that they are all high quality single crystals.

EXAMPLE 5

Gadolinium oxysulfide ($Gd_2O_2S$) powder activated with Pr of 0.037% in terms of weight ratio, is charged in a capsule made of tantalum having an inner volume of 500 cc, and after deaerating, the capsule was sealed.

Subsequently, the sealed capsule was placed in an HIP apparatus, and treated by using an Ar gas as a pressure medium under 1000 kgf/cm² at 1450° C. for 1.5 hours. Next, the capsule made of tantalum was removed from the above treated compact to take out a polycrystalline sintered body of $(Gd,Pr)_2O_2S$ and cut to a suitable shape. The above cut product was placed in an apparatus made of tantalum and having substantially the same inner shape as that of the cut product, and after deaerating, the capsule was sealed. Thereafter, to the sealed capsule was applied zone melting under a pressure of 10 kgf/cm² at 2100° C. to prepare a $(Gd,Pr)_2O_2S$ single crystal.

The thus prepared $(Gd,Pr)_2O_2S$ single crystal had a size of about 400 cc. Also, when the composition of the $(Gd,Pr)_2O_2S$ single crystal was analyzed, the results obtained were Gd=83.07%, Pr=0.035% and S=8.46% whereas the stoichiometric composition was Gd=83.04%, Pr=0.037% and S=8.47% in terms of weight ratio. Thus, deviation of respective elements from the stoichiometric composition was within the range of ±5% in terms of weight ratio and it could be confirmed that the single crystal had high quality.

The above $(Gd,Pr)_2O_2S$ single crystal was used as a scintillator and a light output under X-ray excitation of 120 kVP was measured to give a good result of 1.5-fold to that of $CaWO_4$. Incidentally, by using a $(Gd,Pr)_2O_2S$ single crystal in which an amount of S is decreased prepared in the same manner as in Comparative example 1, a light output was similarly measured to give a result of 0.9-fold to that $CaWO_4$ whereby characteristics were deteriorated.

Figure 3:
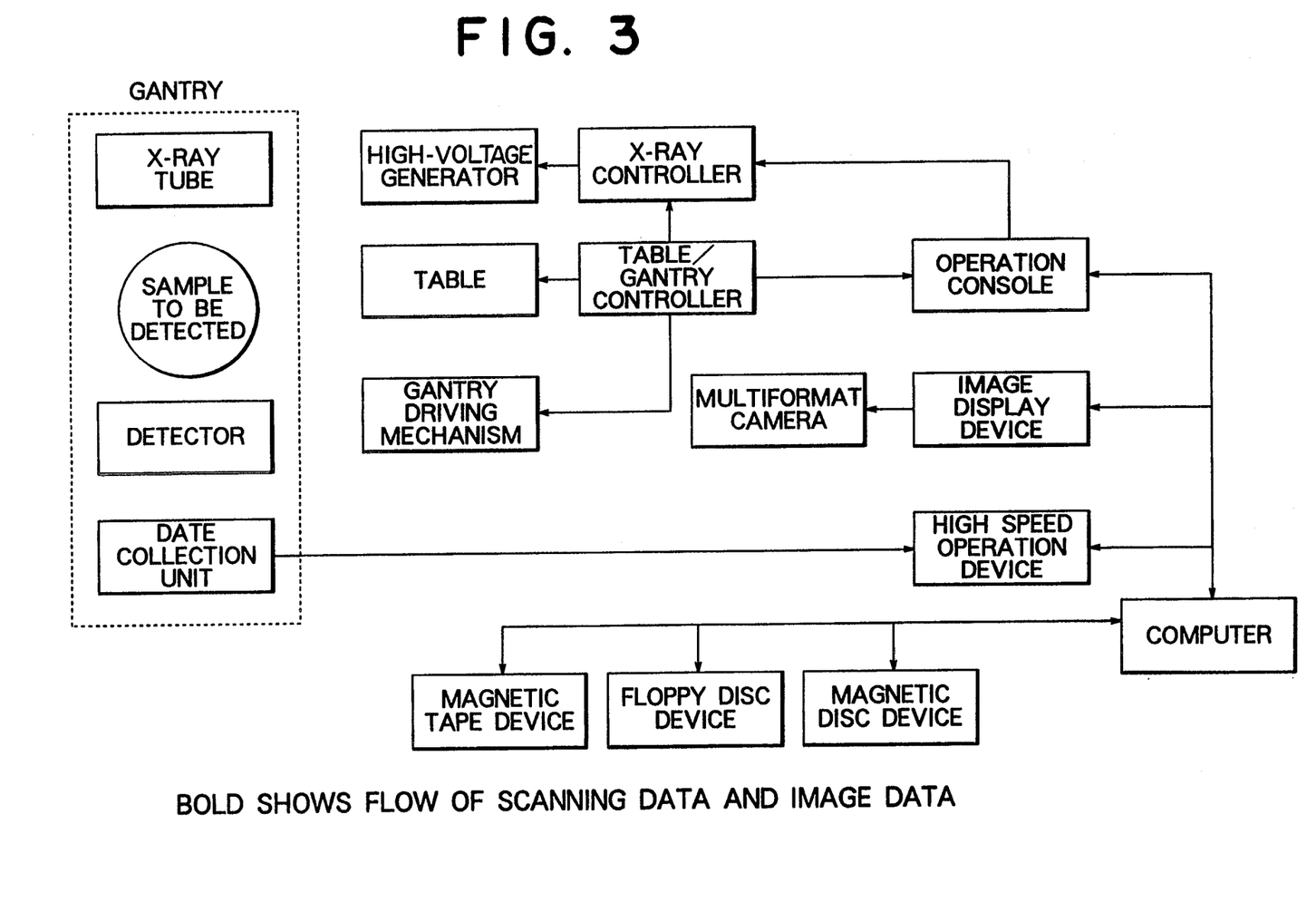
FIG. 3 is a constitutional view of a system of an X-ray CT prepared by using a scintillator material prepared from a single crystal of a compound according to one Example of the present invention.

FIG. 3 shows a constitutional example of a system of an X-ray CT.

Figure 4:
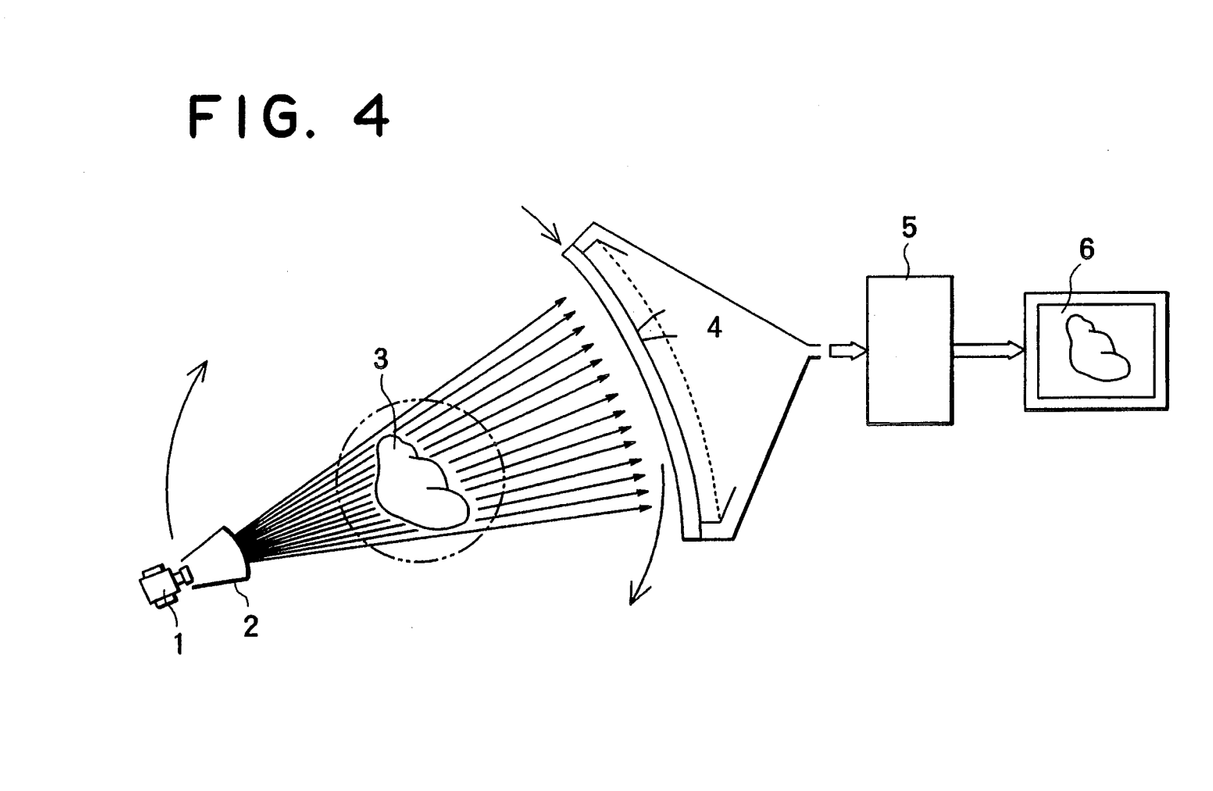
FIG. 4 is a constitutional example of an X-ray CT scanner using a single crystal of a compound according to one Example of the present invention as a scintillator.

FIG. 4 shows an example using a scintillator for detecting an X-ray CT, wherein the reference numeral 1 is an X-ray tube, 2 is a collimator, 3 is a material to be detected, 4 is a scintillator, 5 is a computer and 6 is a display.

EXAMPLE 6

In the same manner as in Example 5, a $(Gd,Nd)_2O_2S$ single crystal in which Nd had been doped to $Gd_2O_2S$ in an amount of 1.0% by weight was prepared. Continuous scintillation characteristics of the resulting single crystal as a laser rod were compared to those of the representative laser material $Y_5Al_5O_{12}:Nd$, and the results gave a scintillation threshold value of about 60% and a slope efficiency of about 5 times. Also, when the composition of the above $(Gd,Nd)_2O_2S$ single crystal was analyzed in the same manner as in Example 1, good results of Gd=82.08%, Nd=1.00%, S=8.46% and O=8.46% were obtained whereas the stoichiometric composition was Gd=82.08%, Nd=1.00%, S=8.47% and O=8.5% in terms of weight ratio.

EXAMPLE 7

Yttrium oxysulfide $(Y_2O_2S)$ powder containing 3.00% by weight of Eu was treated in the same manner as in Example 5 to obtain a transparent $(Y,Eu)_2O_2S$ single crystal.

Also, as a comparison of the present invention, the same yttrium oxysulfide $(Y_2O_2S)$ powder containing 3.0% by weight of Eu was treated in the same manner as in Comparative example 1 and a single crystal (Comparative example 5) was prepared but it had wholly colored to purple.

Compositions of the respective single crystals of Example 7 and Comparative example 5 were analyzed in the same manner as in Example 1. The results are shown in Table 2. Also, from these respective single crystals, specimens having a thickness of 1 mm were each cut out and emission luminances thereof under a 25 keV electron beam excitation. The results are also shown in Table 2. Incidentally, the evaluation results of luminances are shown as a relative value when the luminance of the single crystal of Example is made 100 (hereinafter the same).

TABLE 2

|  | Composition ratio (weight %) | | | | State of single crystal | Luminance |
| --- | --- | --- | --- | --- | --- | --- |
|  | Y | Eu | S | O | | |
| Stoichiometric ratio | 70.52 | 3.00 | 13.25 | 13.23 | | |
| Example 7 (found value) | 70.54 | 3.00 | 13.23 | 13.23 | Transparent | 100 |
| Comparative example 5 (found value) | 71.98 | 3.06 | 11.47 | 13.49 | Semi-transparent purple | 66 |

As clearly seen from Table 2, the single crystal according to Example 7 is a good single crystal in which deviation in composition from the stoichiometric composition is extremely little. Thus, it can be understood that luminance excited by an electron beam is extremely good as compared to the single crystal of Comparative example 5.

EXAMPLE 8

Yttrium oxysulfide $(Y_2O_2S)$ powder containing 1.00% by weight of Nd was treated in the same manner as in Example 5 to obtain a transparent $(Y,Nd)_2O_2S$ single crystal.

Also, as a comparison of the present invention, the same yttrium oxysulfide $(Y_2O_2S)$ powder containing 1.00% by weight of Nd was treated in the same manner as in Comparative example 1 and a single crystal (Comparative example 6) was prepared but it had wholly colored to pale purple.

Compositions of the respective single crystals of Example 8 and Comparative example 6 were analyzed in the same manner as in Example 1. The results are shown in Table 3. Also, from these respective single crystals, specimens having a thickness of 1 mm were each cut out and emission luminances thereof under a 253.7 nm ultraviolet ray excitation. The results are also shown in Table 3.

TABLE 3

|  | Composition ratio (weight %) | | | | State of single crystal | Luminance |
| --- | --- | --- | --- | --- | --- | --- |
|  | Y | Nd | S | O | | |
| Stoichiometric ratio | 72.52 | 1.00 | 13.25 | 13.23 | | |
| Example 8 (found value) | 72.55 | 1.00 | 13.23 | 13.22 | Transparent | 100 |
| Comparative example 6 (found value) | 74.00 | 1.02 | 11.49 | 13.49 | Pale purple | 53 |

As clearly seen from Table 3, the single crystal according to Example 8 is a good single crystal in which deviation in composition from the stoichiometric composition is extremely little. Thus, it can be understood that luminance excited by a ultraviolet ray as a laser rod is extremely good as compared to the single crystal of Comparative example 6.

EXAMPLE 9

Yttrium oxysulfide ($Y_2O_2S$) powder containing 0.10% by weight of Pr was treated in the same manner as in Example 5 to obtain a transparent $(Y,Pr)_2O_2S$ single crystal. Also, as a comparison of the present invention, the same yttrium oxysulfide ($Y_2O_2S$) powder containing 0.10% by weight of Pr was treated in the same manner as in Comparative example 1 to prepare a single crystal (Comparative example 7).

Compositions of the respective single crystals of Example 9 and Comparative example 7 were analyzed in the same manner as in Example 1. The results are shown in Table 4. Also, from these respective single crystals, specimens having a thickness of 1 mm were each cut out and emission luminances thereof under a 120 kVP X-ray excitation. The results are also shown in Table 4.

TABLE 4

| | Composition ratio (weight %) | | | | |
|---|---|---|---|---|---|
| | Y | Pr | S | O | Luminance |
| Stoichiometric composition | 73.42 | 0.10 | 13.25 | 13.23 | |
| Example 9 (found value) | 73.44 | 0.10 | 13.23 | 13.23 | 100 |
| Comparative example 7 (found value) | 75.63 | 0.10 | 10.64 | 13.63 | 73 |

As clearly seen from Table 4, the single crystal according to Example 9 is a good single crystal in which deviation in composition from the stoichiometric composition is extremely little. Thus, it can be understood that luminance as a scintillator is extremely good as compared to the single crystal of Comparative example 7.

EXAMPLES 10 to 14

Respective single crystals shown in Table 5 were each prepared by the same treatment as in Example 5 and Comparative example 1. The compositions of these respective single crystals according to Examples and Comparative examples were analyzed in the same manner as in Example 1. Also, light outputs (detailed conditions are the same as in Examples 7, 8 and 9) of these single crystals under the conditions shown in Table 5 were measured. These results are summarized in Table 5.

TABLE 5

| | Composition ratio (weight %) | | | | Luminance |
|---|---|---|---|---|---|
| $(Y, Tb)_2O_2S$ | Y | Tb | S | O | |
| Stoichiometric composition | 73.42 | 0.10 | 13.25 | 13.23 | Electron beam excitation |
| Example 10 (found value) | 73.34 | 0.10 | 13.22 | 13.24 | 100 |
| Comparative example 8 (found value) | 75.60 | 0.10 | 10.60 | 13.70 | 73 |
| $(La, Tb)_2O_2S$ | La | Tb | S | O | |
| Stoichiometric composition | 81.16 | 0.10 | 9.38 | 9.36 | Electron beam excitation |
| Example 11 (found value) | 81.16 | 0.11 | 9.35 | 9.38 | 100 |
| Comparative example 9 (found value) | 82.58 | 0.10 | 7.81 | 9.51 | 73 |
| $(La, Pr)_2O_2S$ | La | Pr | S | O | |
| Stoichiometric composition | 81.16 | 0.10 | 9.38 | 9.36 | X-ray excitation |

TABLE 5-continued

| | Composition ratio (weight %) | | | | Luminance |
|---|---|---|---|---|---|
| Example 12 (found value) | 81.18 | 0.10 | 9.32 | 9.40 | 100 |
| Comparative example 10 (found value) | 82.36 | 0.10 | 8.09 | 9.45 | 65 |
| $(La, Eu)_2O_2S$ | La | Eu | S | O | |
| Stoichiometric composition | 78.26 | 3.00 | 9.38 | 9.36 | Electron beam excitation |
| Example 13 (found value) | 78.28 | 3.00 | 9.34 | 9.38 | 100 |
| Comparative example 11 (found value) | 79.83 | 3.06 | 7.54 | 9.57 | 48 |
| $(La, Nd)_2O_2S$ | La | Nd | S | O | |
| Stoichiometric composition | 80.26 | 1.00 | 9.38 | 9.36 | Ultraviolet ray excitation |
| Example 14 (found value) | 80.29 | 1.00 | 9.36 | 9.35 | 100 |
| Comparative example 12 (found value) | 81.87 | 1.03 | 7.56 | 9.54 | 65 |

EXAMPLE 15

In a capsule made of molybdenum was charged 350 g of yttrium vanadate ($YVO_4$: melting point 1,810° C.) powder, and after deaerating, the capsule was sealed. Subsequently, the sealed capsule was placed in an HIP apparatus and treated by using an Ar gas as a pressure medium under 1000 kgf/cm$^2$ at 1350° C. for one hour. Next, the capsule made of molybdenum was removed from the above treated compact to take out a polycrystalline sintered body of $YVO_4$ and molded to a suitable shape. The above molded product was placed in an apparatus made of molybdenum and having substantially the same inner shape as that of the molded product, and after deaerating, the apparatus was sealed.

Thereafter, to the above sealed apparatus was applied zone melting under a pressure of 5 kgf/cm$^2$ at 1810° C. to prepare a $YVO_4$ single crystal. The thus prepared $YVO_4$ single crystal had a size of about 35 cc.

Also, as a comparison of the present invention, yttrium vanadate powder was placed in a crucible made of molybdenum and after melting under Ar pressurized atmosphere of 5 kgf/cm$^2$, a single crystal (Comparative example 13) was prepared according to the drawing method at 1810° C.

Compositions of the respective single crystals of Example 15 and Comparative example 13 were determined by the ICP emission spectroscopic analysis after decomposing with HCl under heating. The results are shown in Table 6.

TABLE 6

| | Composition ratio (weight %) | | |
|---|---|---|---|
| | Y | V | O |
| Stoichiometric composition | 43.63 | 24.98 | 31.39 |
| Example 15 (found value) | 43.65 | 24.95 | 31.40 |
| Comparative example 13 (found value) | 44.96 | 22.70 | 32.34 |

As clearly seen from Table 6, it can be understood that the single crystal according to Example 15 is a good single crystal in which deviation in composition from the stoichiometric composition is extremely little.

EXAMPLE 16

Yttrium vanadate (YVO$_4$) powder containing 1.00% by weight of Nd was treated in the same manner as in Example 15 to obtain a (Y, Nd)VO$_4$ single crystal. Also, as a comparison of the present invention, by using the same yttrium vanadate (YVO$_4$) powder containing 1.0% by weight of Nd, a single crystal (Comparative example 14) was prepared according to the drawing method which is the same as in Comparative example 13.

Compositions of the respective single crystals of Example 16 and Comparative example 14 were analyzed in the same manner as in Example 1. The results are shown in Table 7. Also, luminances of these respective single crystals were measured under a 253.7 nm ultraviolet ray excitation. The results are also shown in Table 7.

TABLE 7

| | Composition ratio (weight %) | | | | Luminance |
|---|---|---|---|---|---|
| | Y | Nd | V | O | |
| Stoichiometric composition | 42.63 | 1.00 | 24.98 | 31.39 | |
| Example 16 (found value) | 42.66 | 1.00 | 24.95 | 31.39 | 100 |
| Comparative example 14 (found value) | 43.96 | 1.02 | 22.71 | 32.31 | 63 |

As clearly seen from Table 7, the single crystal according to Example 16 is a good single crystal in which deviation in composition from the stoichiometric composition is extremely little. Thus, it can be understood that luminance excited by a ultraviolet ray as a laser rod is extremely good as compared to the single crystal of Comparative example 14.

Also, as seen from the table, it can be understood that the single crystal of Example 16 is extremely excellent in luminance under a ultraviolet ray excitation as a laser rod as compared to those of Comparative examples 13 and 14.

Figure 2:
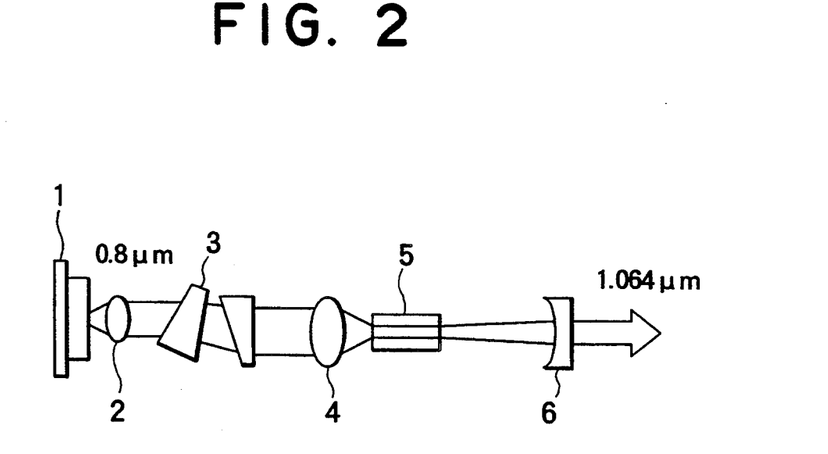
FIG. 2 is a constitutional view of an LD-excited Nd:YVO₄ laser oscillator prepared by using a laser rod prepared from a single crystal of a compound according to Example 16 of the present invention.

In FIG. 2, one constitutional example of a laser oscillator using a laser rod prepared by the single crystal of Example 16. In the figure, the reference numeral 1 is a laser diode, 2 and 3 are lenses, 4 is a condenser, 5 is a laser rod and 6 is an output mirror.

As explained above, according to the present invention, a single crystal can be prepared by preventing decomposition of a compound which is decomposed at a temperature around the melting point, and the size of the single crystal can be made an optional one, whereby it can be realized that a high quality single crystal of a compound in which deviation in a composition from the stoichiometric composition with a large size can be obtained with good reproducibility.

Also, the single crystal of a compound according to the present invention has extremely large size as compared to those of the conventional single crystals of compounds and is extremely excellent in luminance under an electron beam or ultraviolet ray excitation as a laser rod, and also is possible to effect scintillation with a high efficiency so that it can be realized to use for a laser oscillator as shown in FIG. 2. Also, Gd$_2$O$_2$S, La$_2$O$_2$S and Y$_2$O$_2$S to which Pr is doped, respectively, are extremely excellent in luminances as compared to those of the conventional single crystals, and they can be used as a scintillator material used for a CT scanner or a color display. FIG. 4 shows one example of a cathode-ray tube used the compound of the present invention as a scintillator material.

What is claimed is:

1. A process for preparing a single crystal of a compound in which at least part of the compound decomposes at a temperature around the melting point of the compound, which comprises the steps of:

deaerating and sealing powder of a starting material of said single crystal in a first sealable vessel made of a high melting point substance having low reactivity with said starting material at a temperature around a sintering temperature;

sintering the deaerated and sealed powder to form a polycrystalline sintered body at a temperature of $\frac{1}{2}$ or higher of the melting point of said starting material in terms of the absolute temperature and at high pressure;

deaerating and sealing said polycrystalline sintered body in a second sealable vessel made of a high melting point substance which has low reactivity with the sintered body at a temperature during a process for single crystallization and having an inner shape corresponding to the shape of said sintered body; and heating the deaerated and sealed polycrystalline sintered body at a temperature from the melting temperature of said starting material to 1.05 times the melting temperature of said starting material under pressure to form the single crystal of the compound by using a zone melting method or a vertical melting method.

2. The process of preparing the single crystal of the compound according to claim 1, wherein the high pressure for sintering the powder is 300 kgf/cm$^2$ or higher.

3. The process of preparing the single crystal of the compound according to claim 1, wherein said compound has a composition represented by the formula:

$$RE_2O_2S_{1-x}$$

wherein RE is at least one selected from the group consisting of Y, La, Ce, Pr, Nd, Sm, Eu, Gd, Tb, Dy, Ho, Er, Tm, Yb and Lu, and x represents a number satisfying $0 < x < 1$.

4. The process of preparing the single crystal of the compound according to claim 1, wherein said compound has a composition represented by the formula:

$$REV_{1-x}O_4$$

wherein RE is at least one selected from the group consisting of Y, La, Ce, Pr, Nd, Sm, Eu, Gd, Tb, Dy, Ho, Er, Tm, Yb and Lu, and x represents a number satisfying $0 < x < 1$.

5. The process of preparing the single crystal of the compound according to claim 1, wherein said single crystal has a volume of 5 cc or more.

6. The process of preparing the single crystal of the compound according to claim 1, wherein deviation of respective elements in a composition of said single crystal from a stoichiometric composition is within the range of ±5% in terms of a weight ratio.

7. The process of preparing the single crystal of the compound according to claim 1, wherein the high pressure for sintering the powder to 500 kgf/cm$^2$ or higher.

8. The process of preparing the single crystal of the compound according to claim 1, wherein the high pressure for sintering the powder is 1000 kgf/cm$^2$ or higher.

9. The process of preparing the single crystal of the compound according to claim 3, wherein deviation of respective elements in a composition of said compound from a stoichiometric composition is within the range of ±5% in terms of a weight ration.

10. The process of preparing the single crystal of the compound according to claim 4, wherein deviation of respective elements in a composition of said compound from a stoichiometric composition is within the range of ±5% in terms of a weight ratio.

11. The process of preparing the single crystal of the compound according to claim 1, wherein said first and second sealable vessel are made of the same substance.

12. The process of preparing the single crystal of the compound according to claim 1, wherein said first sealable vessel is made of a metal selected from the group consisting of Ta, Mo, W, Pt and Nb.

* * * * *